(12) United States Patent
Watakabe et al.

(10) Patent No.: US 11,855,117 B2
(45) Date of Patent: Dec. 26, 2023

(54) SEMICONDUCTOR DEVICE AND METHOD OF MANUFACTURING SEMICONDUCTOR DEVICE

(71) Applicant: Japan Display Inc., Tokyo (JP)

(72) Inventors: Hajime Watakabe, Tokyo (JP); Akihiro Hanada, Tokyo (JP); Marina Mochizuki, Tokyo (JP); Ryo Onodera, Tokyo (JP); Fumiya Kimura, Tokyo (JP); Isao Suzumura, Tokyo (JP)

(73) Assignee: JAPAN DISPLAY INC., Tokyo (JP)

( * ) Notice: Subject to any disclaimer, the term of this patent is extended or adjusted under 35 U.S.C. 154(b) by 189 days.

(21) Appl. No.: 17/167,081

(22) Filed: Feb. 4, 2021

(65) Prior Publication Data

US 2021/0257402 A1 Aug. 19, 2021

(30) Foreign Application Priority Data

Feb. 18, 2020 (JP) ................................. 2020-025023

(51) Int. Cl.
*H01L 27/146* (2006.01)

(52) U.S. Cl.
CPC .... *H01L 27/14643* (2013.01); *H01L 27/1461* (2013.01); *H01L 27/14636* (2013.01); *H01L 27/14689* (2013.01)

(58) Field of Classification Search
CPC ........... H01L 27/14643; H01L 27/1461; H01L 27/14636; H01L 27/14689
USPC .......................... 257/292, 291, 290, 288, 213
See application file for complete search history.

(56) References Cited

U.S. PATENT DOCUMENTS

| 2014/0103347 | A1 | 4/2014 | Ishino | |
| 2014/0158899 | A1* | 6/2014 | Sugiyama | ............... G01T 1/208 |
| | | | | 250/394 |

FOREIGN PATENT DOCUMENTS

| CN | 103219431 A | * | 7/2013 | ....... H01L 27/14632 |
| JP | 5-235395 A | | 9/1993 | |
| JP | 2008-282844 A | | 11/2008 | |

(Continued)

OTHER PUBLICATIONS

Japanese Office Action dated Oct. 17, 2023, in corresponding Japanese Application No. 2020-025023, 8pp.

*Primary Examiner* — Tucker J Wright
(74) *Attorney, Agent, or Firm* — XSENSUS LLP

(57) ABSTRACT

The present invention provides a technology which realizes a reliable semiconductor device including a photosensor device by preventing pent roofs of edges of a $P^+$ layer from being generated and a metal wiring installed over the $P^+$ layer from coming down while securing the electrical conductivity of the $P^+$ layer. The semiconductor device includes a photosensor including a photodiode formed on a substrate. The photodiode includes: a cathode electrode; a laminated structure that is formed on the cathode electrode and in which an $N^+$ layer, an I layer, and a $P^+$ layer are laminated in this order; an anode electrode formed on the $P^+$ layer; a first insulating film formed so as to cover a portion of the anode electrode and edges of the laminated structure; and a metal wiring connected to the anode electrode. The edges of the laminated structure are formed in forward tapered shapes in a cross-sectional view.

3 Claims, 14 Drawing Sheets

(56) References Cited

FOREIGN PATENT DOCUMENTS

JP 2014-78651 A 5/2014

* cited by examiner

SEMICONDUCTOR DEVICE AND METHOD OF MANUFACTURING SEMICONDUCTOR DEVICE

CROSS-REFERENCE TO RELATED APPLICATION

The present application claims priority from Japanese Patent Application JP 2020-025023 filed on Feb. 18, 2020, the content of which is hereby incorporated by reference into this application.

BACKGROUND OF THE INVENTION

The present disclosure relates to semiconductor devices including photosensor devices and a method of manufacturing the semiconductor devices.

Photosensor devices using photoelectric conversion have been widely used not only for image recognition but also for the fields of biometrics and others. As a photoelectric conversion element used for a photosensor device, a PIN-type photodiode using, for example, amorphous silicon (hereinafter also referred to as a-Si) is well known (refer to Japanese Unexamined Patent Application Publication No. Hei 5-235395).

In the case where a PIN-type photodiode using a-Si is formed on a substrate, an $N^+$ layer, an I layer, and a $P^+$ layer are laminated in this order on a lower electrode. Subsequently, there are some cases where the $N^+$ layer, the I layer, and the $P^+$ layer are processed at the same time by means of dry etching using the same etching mask.

SUMMARY OF THE INVENTION

In dry etching, the etching rate of a $P^+$ layer is lower than the etching rate of an I layer. Therefore, the edges of the $P^+$ layer remain as pent roof-shaped structures in some cases. Owing to these pent roof-type objects, there are some cases where a metal wiring installed above the $P^+$ layer sometimes comes down.

The inventors of the present invention have found out that the reason why the etching rate of a $P^+$ layer is lower than the etching rate of an I layer is that the crystallinity of a $P^+$ layer is higher than the crystallinity of a I layer. In addition, the inventors have found out that, after a $P^+$ layer is formed on an I layer, the etching rate of the $P^+$ layer can be conformed to the etching rate of the I layer by deteriorating the crystallinity of the $P^+$ layer.

An object of the present disclosure is to provide a technology using which a highly reliable semiconductor device including a photosensor device can be materialized by preventing the pent roofs of the edges of a $P^+$ layer from being generated and preventing a metal wiring installed above the $P^+$ layer from coming down while securing the electrical conductivity of the $P^+$ layer.

Problems other than the above and new features will be explicitly shown by the descriptions of this specification and the accompanying drawings.

The outline of a typical aspect of the present disclosure will be briefly explained as follows.

To put it concretely, a semiconductor device according to this disclosure includes a photosensor having a photodiode formed on a substrate.

The photodiode includes:
a cathode electrode;
a laminated structure that is formed on the cathode electrode and in which an $N^+$ layer, an I layer, and a $P^+$ layer are laminated in this order;
an anode electrode formed on the $P^+$ layer;
a first insulating film formed so as to cover an upper portion of the anode electrode and edges of the laminated structure; and
a metal wiring connected to the anode electrode.

The edges of the laminated structure are formed in forward tapered shapes in a cross-sectional view.

Furthermore, a method of manufacturing the semiconductor device includes the steps of:
forming a first organic insulating film on a substrate;
selectively forming a cathode electrode on the first organic insulating film;
forming an $N^+$ layer so as to cover an upper portion of the first organic insulating film and the cathode electrode;
forming an I layer so as to cover the $N^+$ layer;
forming a $P^+$ layer so as to cover the I layer;
executing boron ion implantation on the $P^+$ layer after the formation of the $P^+$ layer;
selectively forming a resist film on the $P^+$ layer; and
executing dry etching on the $P^+$ layer, the I layer, and the $N^+$ layer using the resist film as a mask.

DETAILED DESCRIPTION OF THE PREFERRED EMBODIMENTS

Figure 1:
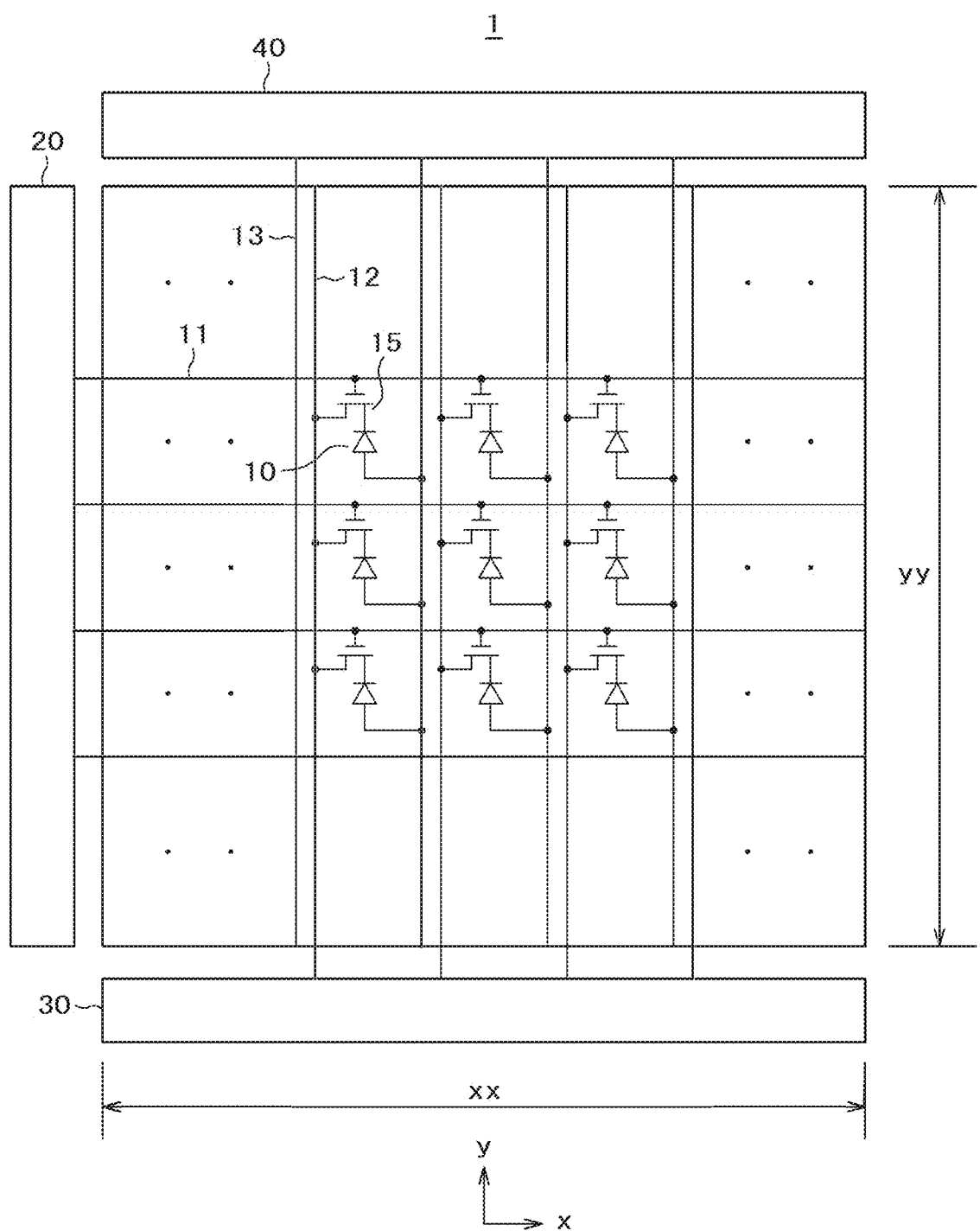
FIG. 1 is a plan view of a semiconductor device according to an example.

Hereinafter an embodiment of the present invention will be explained with reference to the accompanying drawings.

Here, the following disclosure is only an example, and it goes without saying that various modifications that may be made accordingly by those skilled in the art without deviating from the gist of the present invention fall within the scope of the present invention. Furthermore, there are some cases where, in the accompanying drawings, the widths, thicknesses, shapes, and the like of respective portions of the actual embodiment are schematically depicted differently from what they really are in order to give more specific depictions, but these depictions are only examples, so that the interpretation of the present invention is not limited by these depictions.

In addition, in this specification and the accompanying drawings, there are some cases where the same components as components that have appeared in already-described drawings are given the same reference signs, and detailed explanations about them may be omitted accordingly.

Embodiment

First, a semiconductor device according to the present embodiment will be explained. The semiconductor device (1) as a photosensor device includes PIN-type photo diodes (10). A PIN-type photodiode (10) includes a laminated structure (127) in which an $N^+$ layer (130), an I layer (intrinsic layer 131), and a $P^+$ layer (132), which are made of amorphous silicon (hereinafter also referred to as a-Si), are laminated in this order on a lower electrode (cathode electrode 126). Each of the $N^+$ layer (130), the I layer (intrinsic layer 131), and the $P^+$ layer is made of amorphous silicon (hereinafter also referred to as a-Si). After the $P^+$ layer (132) is formed, boron ions are implanted into the $P^+$ layer (132) in order to deteriorate the crystallinity of the $P^+$ layer (132). Afterward, a resist film (RE) is selectively formed on the $P^+$ layer (132), and the $N^+$ layer (130), the I layer (131), and the $P^+$ layer (132) are etched at the same time by executing dry etching using fluorine (F-based) etching gas. Here, etching the above layers at the same time means that the $N^+$ layer (130), the I layer (131), and the $P^+$ layer (132) are etched sequentially in one dry etching process.

Although the crystallinity of the $P^+$ layer (132) is deteriorated by the boron ion implantation, the carrier concentration of the $P^+$ layer (132) is increased owing to the boron ion implantation, so that the electrical conductivity of the $P^+$ layer (132) is secured or kept intact. Deteriorating the crystallinity of the $P^+$ layer (132) makes it possible to conform the etching rate of the $P^+$ layer (132) to the etching rate of the I layer (131).

Therefore, even if the dry etching is executed on the IO layer (131) and the $P^+$ layer (132) at the same time, pent roof-shaped structures are not generated at the edges of the $P^+$ layer (132). The edges of the I layer (131) and the edges of the $P^+$ layer (132) can be processed in forward tapered shapes respectively. With this, it becomes possible to prevent a metal wiring (142) installed above the $P^+$ layer (132) from coming down, so that a highly reliable semiconductor device including a photosensor device can be materialized.

[Example]

FIG. 1 is a plan view of a semiconductor device according to an example. A semiconductor device 1 includes a photosensor device. In FIG. 1, sensor elements are disposed in a matrix shape in a sensor area. The size of the sensor area is represented by the lateral length xx and the longitudinal length yy of the sensor area being 3 cm and 3 cm respectively, for example. In the sensor area, each scanning line 11 extends in a lateral direction (a first direction x), and scanning lines are arranged in a longitudinal direction (a second direction y). Each detecting line 12 and each electric power line 13 extend in the longitudinal direction, and detecting lines 12 and electric power lines 13 are arranged in the lateral direction. A sensor element is an area surrounded by one scanning line 11 and one detecting line 12 or surrounded by one scanning line 11 and one electric power line 13. In each sensor element, a switching TFT (thin film transistor) 15 and a PIN-type photodiode (hereinafter also referred to as a photodiode) 10 are formed.

A scanning line drive circuit 20 is disposed in a lateral outside of the sensor area, an electric power circuit 40 is disposed in the upper outside of the sensor area, and a detecting circuit 30 is disposed in the lower outside of the sensor area. The scanning line drive circuit 20 and the detecting circuit 30 are formed using TFTs. The scanning lines 11 are sequentially selected downward from up by a shift register installed in the scanning line drive circuit 20.

Each electric power line 13 is connected to the anode electrodes of a constant number of photodiodes 10, and extending in the longitudinal direction, and the electric power lines 13 are connected to the same power supply in the electric power circuit 40 in the upper outside of the sensor area. And an anode potential is supplied to the electric power lines 13. Each detecting line 12 is connected to the drains of the constant number of switching TFTs 15, and the source of each switching TFT 15 is connected to the cathode electrode of the relevant photodiode 10. Each detecting line 12 extends downward from up via the constant number of sensor elements, and photoelectric currents from the constant number of sensor elements are detected by the detecting circuit 30. In FIG. 1, if light is irradiated to a sensor element selected by the relevant scanning line 11, a photoelectric current the magnitude of which is corresponding to the intensity of the irradiated light is generated from the relevant photodiode 10. This photoelectric current is detected by the detecting circuit 30 through each detecting line 12.

Figure 2:
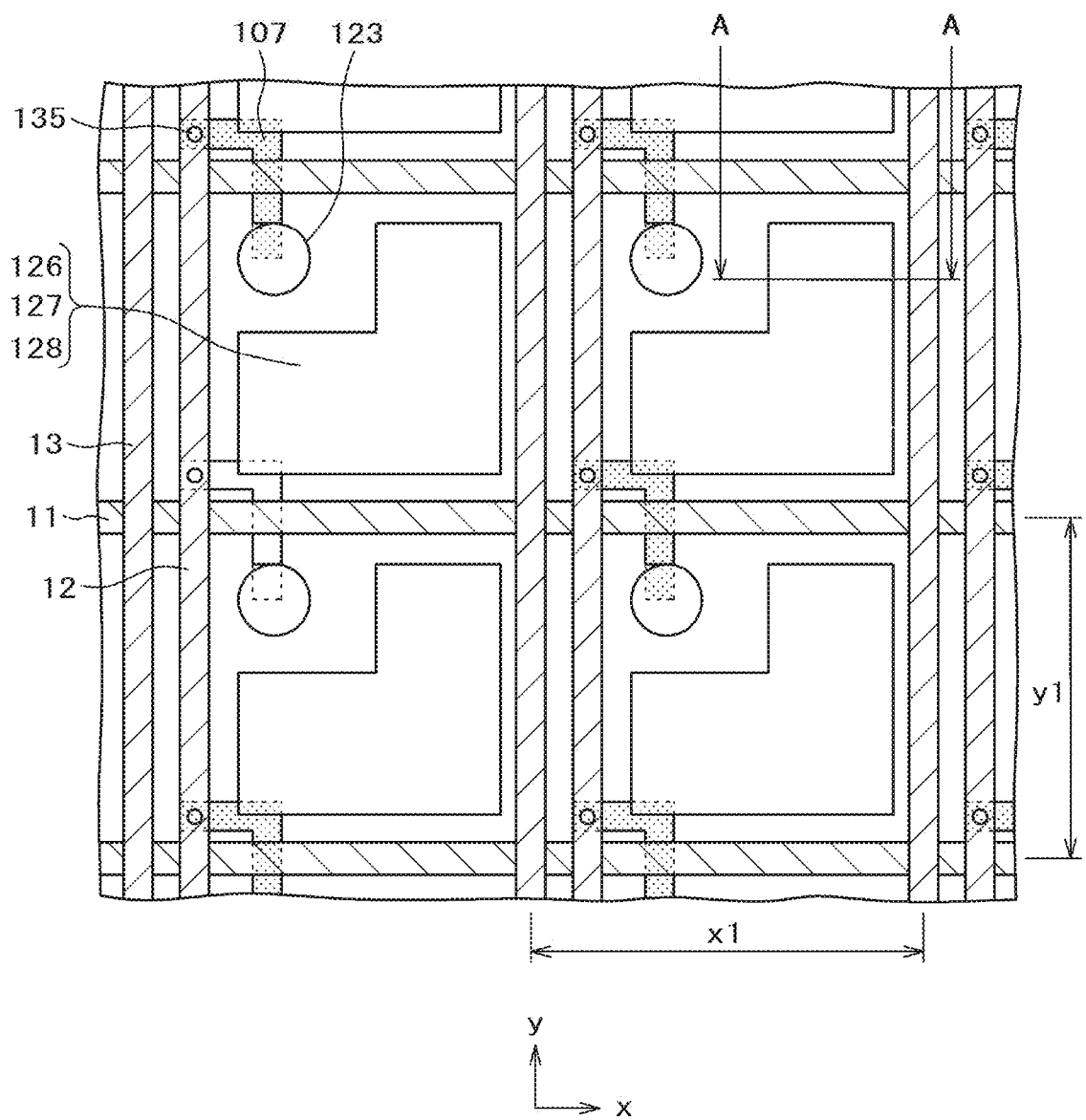
FIG. 2 is a plan view showing a portion of a sensor area shown in FIG. 1 in an enlarged form.

FIG. 2 is a plan view showing a portion of the sensor area shown in FIG. 1 in an enlarged form. In FIG. 2, some electrodes are omitted to depict for simplifying the contents of the drawing. The size of each sensor element is represented by the lateral length xl and the longitudinal length y1 of each sensor element being 50 μm and 50 μm respectively, for example. In FIG. 2, each scanning line 11 extends in a lateral direction (a first direction x), and the scanning lines are arranged in a longitudinal direction (a second direction y). Furthermore, each detecting line 12 and each electric power line 13 extend in the longitudinal direction, and the detecting lines 12 and the electric power lines 13 are arranged in the lateral direction. A photodiode 10 is formed in an area surrounded by one scanning line 11 and one electric power line 13 or surrounded by one scanning line 11 and one detecting line 12. A photodiode 10 includes a cathode electrode 126, a laminated structure 127 in which an N+ layer, an I layer, and a P+ layer are laminated; an anode electrode 128; and the like. The laminated structure 127 can be said to be a photoconductive film and is formed in an island shape.

In addition, the anode electrode 128 is integrally formed across the entirety of the sensor area. In other words, one anode electrode 128 is installed for the entirety of the sensor area, therefore plural cathode electrodes 126 exist for the one anode electrode 128.

A detecting line 12 is connected to an edge of an oxide semiconductor film 107 via a through hole 135. The oxide semiconductor film 107 extends in the lateral direction from under the detecting line 12, and then the oxide semiconductor film 107 bends in the longitudinal direction and passes under a scanning line 11. A switching TFT 15 is installed at this portion. In this case, the scanning line 11 functions as the gate electrode of the switching TFT 15. The other edge of the oxide semiconductor film 107 extending in the longitudinal direction is connected to the cathode electrode 126 of the photodiode 10 via a through hole 123. As will be explained in FIG. 3 and FIG. 4, because the through hole 123 is formed in a thick organic insulating film 122, the diameter of the through hole 123 is large. The laminated structure 127 is formed on the cathode electrode 126, and the anode electrode 128 is formed of transparent electrically conductive film such as ITO (indium tin oxide) on the laminated structure 127. As described above, the photodiode 10 is formed. The anode electrode 128 is connected to an electric power line 13 via a metal wiring 142 that is an outgoing line for the anode electrode 128.

Figure 3:
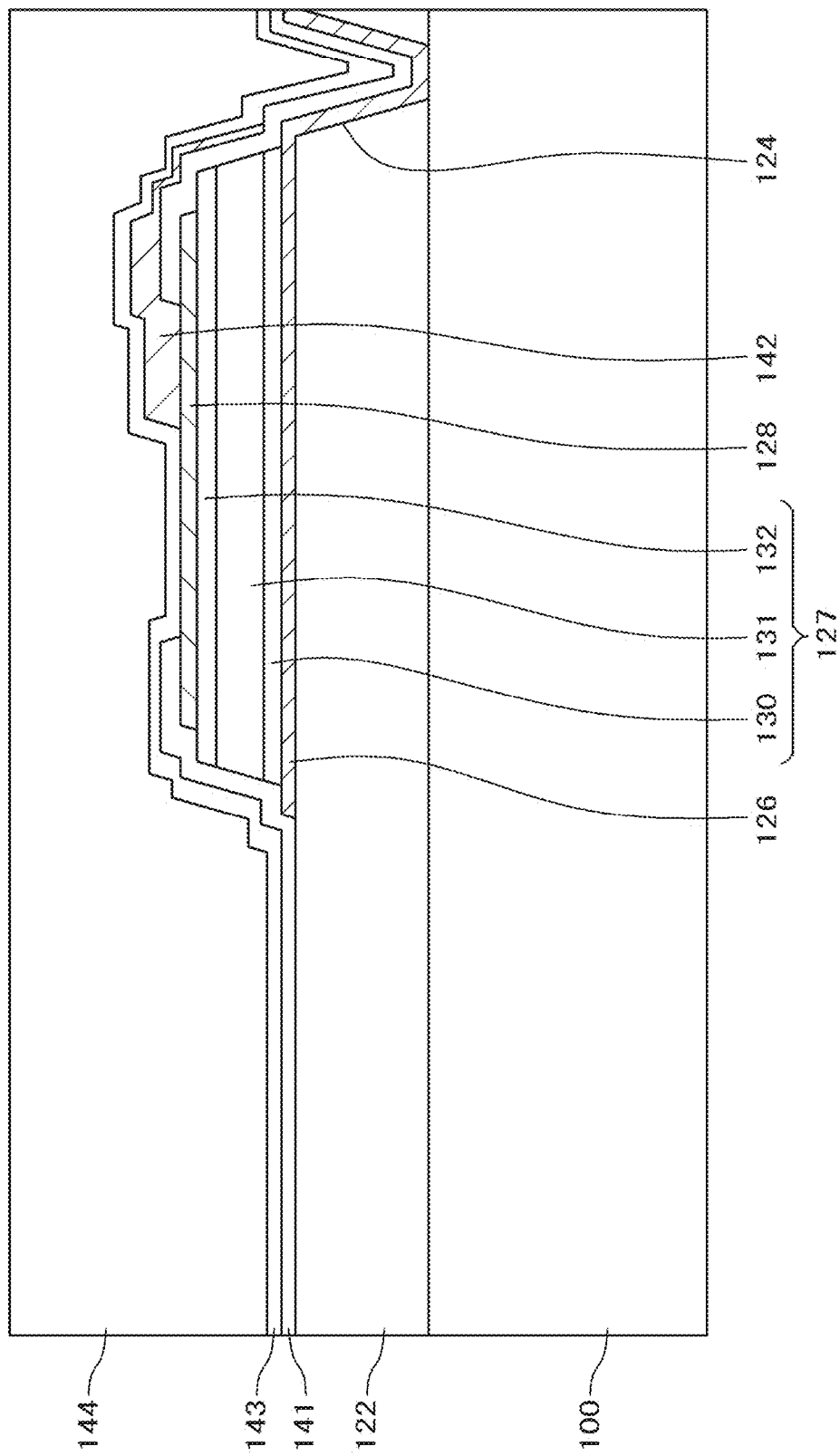
FIG. 3 is a cross-sectional view taken along the line A-A in FIG. 2.
Figure 4:
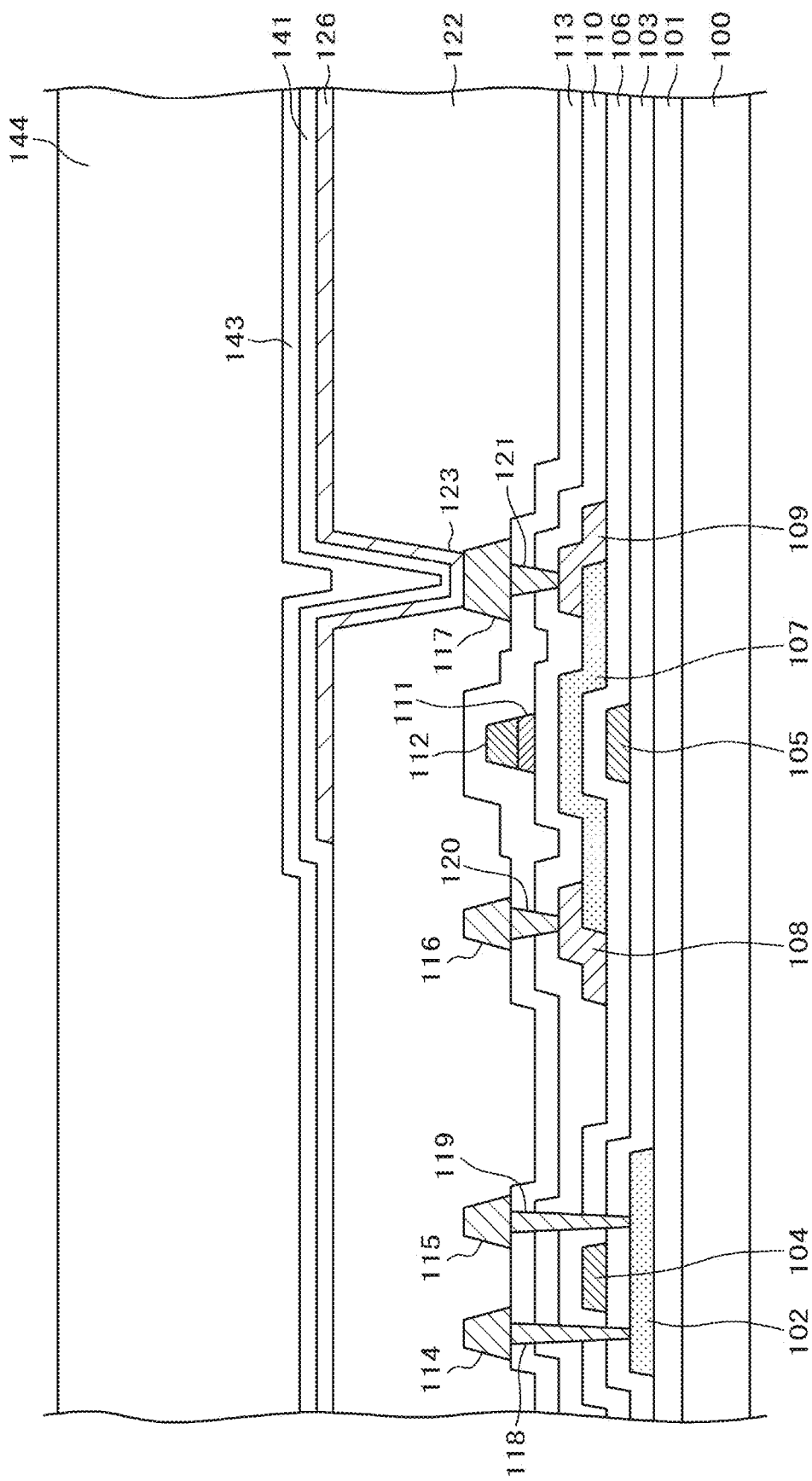
FIG. 4 is a cross-sectional view for explaining configuration examples of a TFT and a switching TFT included in the semiconductor device.

FIG. 3 is a cross-sectional view taken along the line A-A in FIG. 2. FIG. 4 is a cross-sectional view for explaining configuration examples of a TFT and a switching TFT included in the semiconductor device. First, a configuration example of a photodiode 10 will be explained with reference to FIG. 3.

In FIG. 3, a first organic insulating film 122 is formed of, for example, resin such as acrylic so as to cover a substrate 100. Because the organic insulating film 122 also functions as a planarization film, the organic insulating film 122 is formed in such a way that the thickness of the organic insulating film 122 is large, for example, about 2.0 μm to 2.5 μm. The substrate 100 can be formed using a glass substrate or a flexible substrate. A through hole 124 is formed in the organic insulating film 122. Here, it is also conceivable that, as shown in FIG. 4, a laminated film, in which a foundation film 101; a first gate insulating film 103, a first interlayer insulating film 106; a second gate insulating film 110; and a second interlayer insulating film 113 are laminated in this order, is installed between the substrate 100 and the organic insulating film 122.

A cathode electrode 126 is formed of titanium (Ti) film with its thickness being, for example, about 200 nm so as to cover a portion of the organic insulating film 122 and the through hole 124. A portion of the cathode electrode 126 formed in the through hole 124 can also be connected to a detecting line 12 via, for example, a switching TFT 15.

An N+ layer 130 with its thickness being, for example, about 50 nm is selectively formed of a-Si including N-type impurities on the cathode electrode 126. An I layer 131 with its thickness being, for example, about 500 nm is formed of intrinsic a-Si on the N+ layer 130. A P+ layer 132 with its thickness being, for example, about 30 nm is formed of a-Si including P-type impurities on the I layer 131. The N+ layer 130, the I layer 131, and the P+ layer 132 compose the laminated structure 127 of a PIN-type photodiode 10.

The edges of the laminated structure 127 are formed in forward tapered shapes. After P+ layer 132 is formed, boron ion implantation is executed using an acceleration voltage of, for example, about 5 keV on the P+ layer 132 in order to deteriorate the crystallinity of the P+ layer 132. Owing to this boron ion implantation, the etching rate of the P+ layer 132 for dry etching can be conformed to the etching rate of the I layer 131 for dry etching, so that, even if dry etching is executed on the P+ layer 132 and the I layer 131 at the same time, pent roof-shaped structures are prevented from being generated at the edges of the P+ layer 132. In addition, although the crystallinity of the P+ layer 132 is deteriorated owing to the boron ion implantation, the carrier concentration of the P+ layer 132 is increased owing to the boron ion implantation, so that the electrical conductivity of the P+ layer 132 is secured or kept intact.

An anode electrode 128 is formed of ITO film with its thickness being, for example, about 50 nm on the P+ layer 132. This ITO film is crystallized by annealing in order to make the electrical resistivity of the ITO film small.

A first inorganic insulating film 141 is formed so as to cover a portion of the organic insulating film 122; portions of the cathode electrode 126; the edges of the laminated structure 127; and portions and the edges of the anode electrode 128. The inorganic insulating film 141 is formed of SiN with its thickness being, for example, about 20 nm to 100 nm. A metal wiring 142 is formed so as to cover a portion of the anode electrode 128 and an upper portion of the inorganic insulating film 141 so that the metal wiring 142 is electrically connected to the anode electrode 128. Because the metal wiring 142 is formed on an upper portion of the inorganic insulating film 141 covering one edge of the laminated structure 127 formed in a forward tapered shape, the metal wiring 142 does not come down.

A second inorganic insulating film 143 is formed so as to cover two portions of the inorganic insulating film 141, a portion of the anode electrode 128, and the metal wiring 142. The inorganic insulating film 143 are formed of SiN with its thickness being, for example, about 20 nm to 100 nm. A second organic insulating film 144 is formed of resin such as acrylic so as to cover the inorganic insulating film 143. Because the organic insulating film 144 also functions as a planarization film, the organic insulating film 144 is formed in such a way that the thickness of the organic insulating film 144 is large, for example, about 2.0 μm to 2.5 μm.

As shown in FIG. 1, the drive circuit composed of TFTs is formed in the outside of the sensor area. Because polysilicon semiconductor has a large mobility, it is advantageous that the TFTs that compose the drive circuit is formed of polysilicon semiconductor. On the other hand, it is advantageous that switching TFTs 15 formed in the sensor area are formed of oxide semiconductor (sometimes referred to as OS) which has a small leakage current characteristic. Therefore, although a configuration example using a hybrid-type array substrate, in which polysilicon semiconductor TFTs and oxide semiconductor TFTs are used, will be explained in this example, the present invention is applicable not only to the configuration example using a hybrid-type array substrate. A polysilicon semiconductor TFT can also be adopted as a switching TFT 15. In FIG. 4, a left-hand configuration shows one of the polysilicon semiconductor TFTs used for peripheral circuits, and a right-hand configuration shows one of the oxide semiconductor TFTs used for the switching TFTs 15.

Although so-called low-temperature polysilicon, which is obtained by polysiliconizing a-Si using an excimer laser, is used as polysilicon, an annealing temperature for the polysilicon semiconductor exceeds a temperature for forming oxide semiconductor, therefore the polysilicon semiconductor TFTs are formed first, and then the oxide semiconductor TFTs are formed. A polysilicon semiconductor TFT and an oxide semiconductor TFT are formed in lower layers than layers in which a photodiode is formed when viewed from the photodiode 10.

In FIG. 4, a foundation film 101 made of laminated film composed of silicon nitride (SiN) film and silicon oxide (SiO) film is formed on a substrate 100. The foundation film 101 is formed in order to prevent impurities from the substrate 100 from contaminating a polysilicon semiconductor 102 and the oxide semiconductor film 107. The thickness of the SiO film is, for example, about 200 nm. The thickness of the SiN film is, for example, about 20 nm. Here, the SiO film and the SiN film that compose the foundation film 101, and a-Si film can continuously be formed by means of CVD.

The polysilicon film 102 for the TFT is formed on the foundation film 101. The polysilicon film 102 can be obtained in such a way that, first an a-Si film is formed, then the a-Si film is converted into a polysilicon film using an excimer laser, and finally the polysilicon film is patterned. The thickness of the polysilicon film 102 is, for example, about 50 nm.

Subsequently, a first gate insulating film 103 is formed of SiO so as to cover the polysilicon semiconductor film 102. The thickness of the first gate insulating film 103 is, for example, about 100 nm. A first gate electrode 104 is formed of metal or alloy on the first gate insulating film 103. The first gate electrode 104 is formed of, for example, MoW. By the way, a peripheral circuit area and the sensor area are formed at the same time. A light shielding film 105 is formed of the same material as the material of the first gate electrode 104 on a portion corresponding to the switching TFT for the sensor area in concurrence with forming the first gate electrode 104. This light shielding film 105 can also be used as the bottom gate of an oxide semiconductor TFT that will be formed afterward.

A first interlayer insulating film 106 covering the first gate electrode 104 and the light shielding film 105 is formed of laminated film composed of SiO film and SiN film. The thickness of the SiN film is, for example, about 300 nm, and the thickness of the SiO film is, for example, about 200 nm. The oxide semiconductor film 107 is formed on the first interlayer insulating film 106. There are some kinds of oxide semiconductors such as IGZO (indium gallium zinc oxide), ITZO (indium tin zinc oxide), ZnON (zinc oxide nitride), and IGO (indium gallium oxide). IGZO is adopted as an oxide semiconductor used in this example.

It is important for an oxide semiconductor to keep up the amount of oxygen in order to keep its characteristics intact. Therefore, it is necessary that the upper layer of the first interlayer insulating film 106 should be the SiO film. This is because the SiN film supplies hydrogen and deoxidizes the oxide semiconductor. If the SiO film has contact with the oxide semiconductor film 107, oxygen can be supplied from the SiO film to the oxide semiconductor film 107.

A drain protection electrode 108 is laminated on the drain area of the oxide semiconductor film 107, and a source protection electrode 109 is laminated on the source area of the oxide semiconductor film 107. The drain protection electrode 108 and the source protection electrode 109 are formed of metal, and when through holes in the polysilicon TFT are cleaned by hydrofluoric acid (HF acid), the drain protection electrode 108 and the source protection electrode 109 prevent the oxide semiconductor film 107 in through holes in the oxide semiconductor TFT from being erased by the hydrofluoric acid (HF acid).

A second gate insulating film 110 is formed of SiO film so as to cover the oxide semiconductor film 107. The thickness of the SiO film is about 100 nm. A gate alumina film 111 is formed on the SiO film, and a second gate electrode 112 is formed of, for example, MoW alloy on the gate alumina film 111. The characteristics of the oxide semiconductor film 107 is stabilized by oxygen being supplied from the second gate insulating film 110 formed of SiO film and the gate alumina film 111 to the oxide semiconductor film 107.

A second interlayer insulating film 113 is formed of a laminated film composed of SiO film and SiN film so as to cover the second gate electrode 112. The thickness of the SiO film is, for example, about 300 nm, and the thickness of the SiN film is, for example, about 100 nm. There are many cases where the SiO film is disposed lower, that is, nearer to the oxide semiconductor film 107. After the second interlayer insulating film 113 is formed, through holes 118 and 119 are formed in the polysilicon TFT for the peripheral circuit, and thorough holes 120 and 121 are formed in the oxide semiconductor TFT for the sensor area at the same time.

Hydrofluoric (HF) acid cleaning is executed on the through holes 118 and 119 in the polysilicon TFT in order to remove the oxide film, but in this case, in order to prevent hydrofluoric (HF) acid from intruding into the through holes 120 and 121 in the oxide semiconductor TFT and erasing portions of the oxide semiconductor film 107, the drain protection electrode 108 and the source protection electrode 109 are used.

A first drain electrode 114 and a first source electrode 115 are formed for the through hole 118 and the through hole 119 in the polysilicon TFT respectively, and a second drain electrode 116 and a second source electrode 117 are formed for the through hole 120 and the through hole 121 in the oxide semiconductor TFT respectively. The second drain electrode 116 is connected to a detecting line 12.

An organic insulating film 122 is formed so as to cover the second interlayer insulating film 113. A through hole 123 used for connecting the source electrode 117 of the oxide semiconductor TFT and the cathode electrode 126 of the photodiode 10 is formed in the organic insulating film 122. Because the thickness of the organic insulating film 122 is large, the diameter of the through hole 123 becomes larger than the diameter of the through hole 120.

A cathode electrode 126 is formed on the organic insulating film 122. A portion of the cathode electrode 126 is formed in the through hole 123 of the organic insulating film 122, and the cathode electrode 126 is connected to the source electrode 117 via this portion.

An inorganic insulating film 141 is formed of SiN with its thickness being, for example, about 20 nm to 100 nm so as to cover the organic insulating film 122 and the cathode electrode 126. An inorganic insulating film 143 is formed of SiN with its thickness being, for example, about 20 nm to 100 nm so as to cover the inorganic insulating film 141. With this, the semiconductor device 1 is formed as a photosensor device.

(Description of Problems)

Problems will be described with reference to FIG. 5 to FIG. 7.

Figure 5:
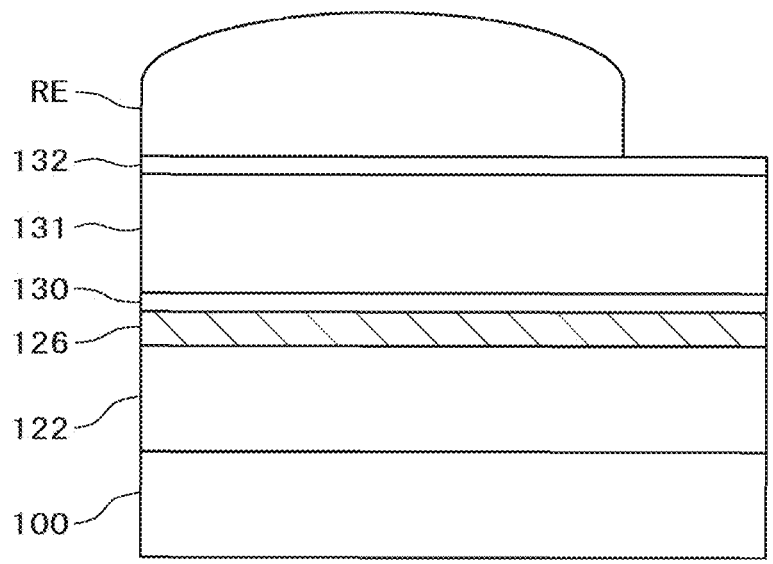
FIG. 5 is a cross-sectional view for explaining a method of manufacturing a semiconductor device according to a comparative example.

FIG. 5 is a cross-sectional view for explaining a method of manufacturing a semiconductor device according to a comparative example. FIG. 5 shows a state in which a cathode electrode 126 composed of Ti film, an N+ layer 130, an I layer 131, and a P+ layer 132 are formed on an organic insulating film 122, and a resist layer RE is selectively formed on the P+ layer 132.

Figure 6:
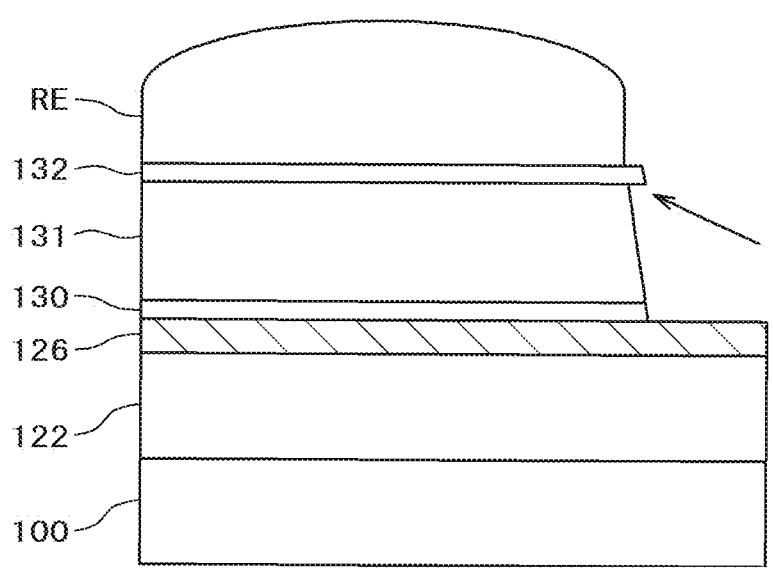
FIG. 6 is a cross-sectional view showing a state in which dry etching is executed on a structure shown in FIG. 5 using an F-based etching gas and a resist film as a mask.

FIG. 6 is a cross-sectional view showing a state in which dry etching is executed on a structure shown in FIG. 5 using an F-based etching gas and a resist film as a mask. When the dry etching is executed on the N+ layer 130, the I layer, and the P+ layer 132 at the same time using the resist film RE as a mask, an edge of the P+ layer 132 remains as a pent roof-shaped structure as shown by an arrow without being etched. This phenomenon occurs because the etching rate of the P+ layer 132 is lower than the etching rate of the I layer 131 in the dry etching. The inventors have found out that a reason why the etching rate of the P+ layer 132 is lower than the etching rate of the I layer 131 is because the crystallinity of the P+ layer 132 is higher than the crystallinity of the I layer 131.

Figure 7:
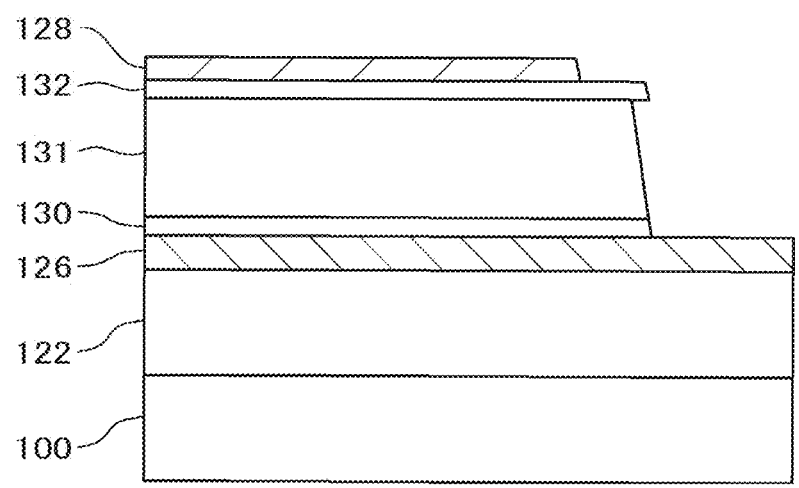
FIG. 7 is a cross-sectional view showing a state in which an anode electrode is selectively formed on a $P^+$ layer.

FIG. 7 is a cross-sectional view showing a state in which an anode electrode 128 is selectively formed on the P+ layer 132. As shown in FIG. 7, the pent roof-shaped structure of the edge of the P+ layer 132 remains even in a state in which the anode electrode 128 made of ITO film is selectively formed on the P+ layer 132. Therefore, if, after an inorganic insulating film 141 is formed after the above process, a metal wiring 142 is formed on the inorganic insulating film 141, there is a high possibility that the metal wiring 142 comes down accordingly owing to insufficient coverage for the pent roof-shaped structure by the inorganic insulating film 141.
(Method of Manufacturing Semiconductor Device)

Next, a method of manufacturing the semiconductor device according to the example will be explained with reference to the accompanying drawings. In the following explanation of the method of manufacturing the semiconductor device, the method of manufacturing the photodiode 10 shown in FIG. 3 will mainly be explained.

Figure 8:
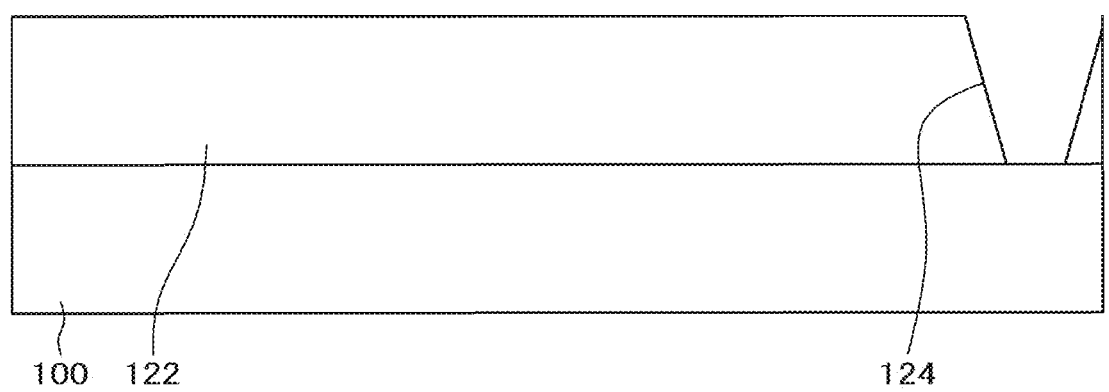
FIG. 8 is a cross-sectional view showing a state in which an organic insulating film is formed on a substrate.

FIG. 8 is a cross-sectional view showing a state in which a first organic insulating film 122 is formed on a substrate 100. A glass substrate or a flexible substrate can be used as the substrate 100. The first organic insulating film 122 is formed of, for example, resin such as acrylic so as to cover the substrate 100. Because the organic insulating film 122 also functions as a planarization film, the organic insulating film 122 is formed with its film thickness being, for example, about 2.0 μm to 2.5 μm. In this example, a through hole 24 is formed in the organic insulating film 12, but there is a case where the through hole is not formed.

Figure 9:
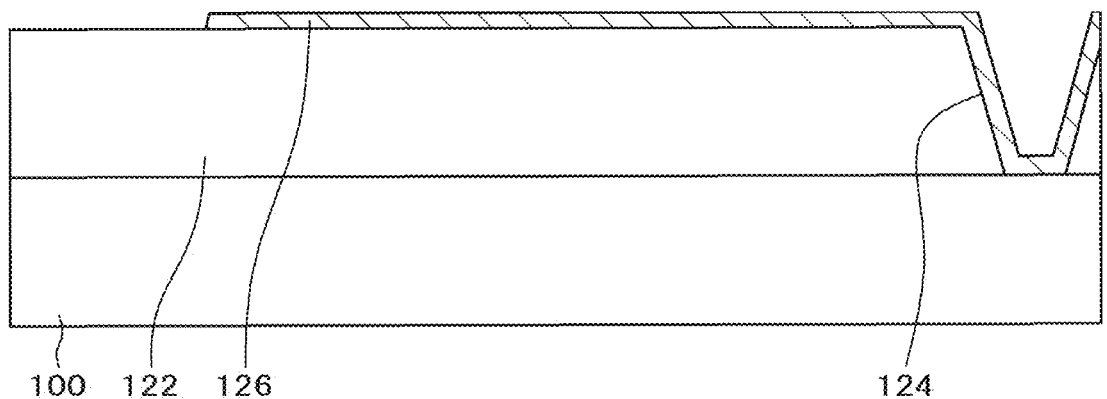
FIG. 9 is a cross-sectional view showing a state in which a cathode electrode is formed.

FIG. 9 is a cross-sectional view showing a state in which a cathode electrode 126 is formed. The cathode electrode 126 is formed so as to cover a portion of the organic insulating film 122 and the inside of the through hole 124. The cathode electrode 126 is formed of Ti film with its thickness being, for example, about 200 nm. A portion of the cathode electrode 126 formed in the through hole 124 can also be connected, for example, to the switching TFT 15. Alternatively, the portion of the cathode electrode 126 formed in the through hole 124 can be connected to a switching TFT included in a display pixel of an organic EL display device.

Figure 10:
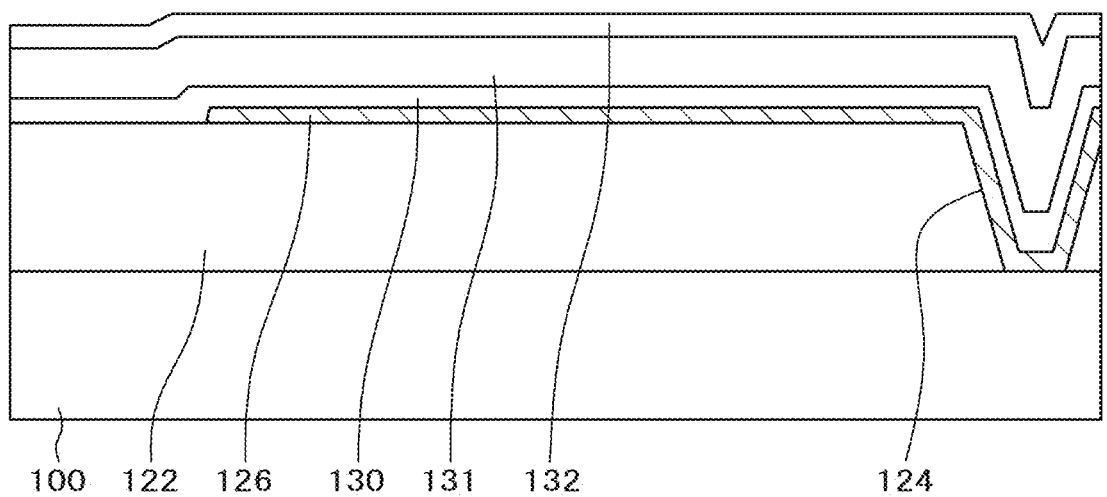
FIG. 10 is a cross-sectional view showing a state in which an $N^+$ layer, an I layer, and a $P^+$ layer are formed so as to cover the organic insulating film and the cathode electrode.

FIG. 10 is a cross-sectional view showing a state in which an N+ layer, an I layer, and a P+ layer are formed so as to cover the organic insulating film and the cathode electrode. First, the N+ layer 130 is formed so as to cover the organic insulating film 122 and the cathode electrode 126. The N+ layer 130 is formed of a-Si including N-type impurities with its thickness being, for example, about 50 nm. Next, the I layer 131 is formed on the N+ layer 130. The I layer 131 is formed of intrinsic a-Si with its thickness being, for example, about 500 nm. Afterward, the P+ layer 132 is formed on the I layer 131. The P+ layer 132 is formed of a-Si including P-type impurities with its thickness being, for example, about 30 nm.

Figure 11:
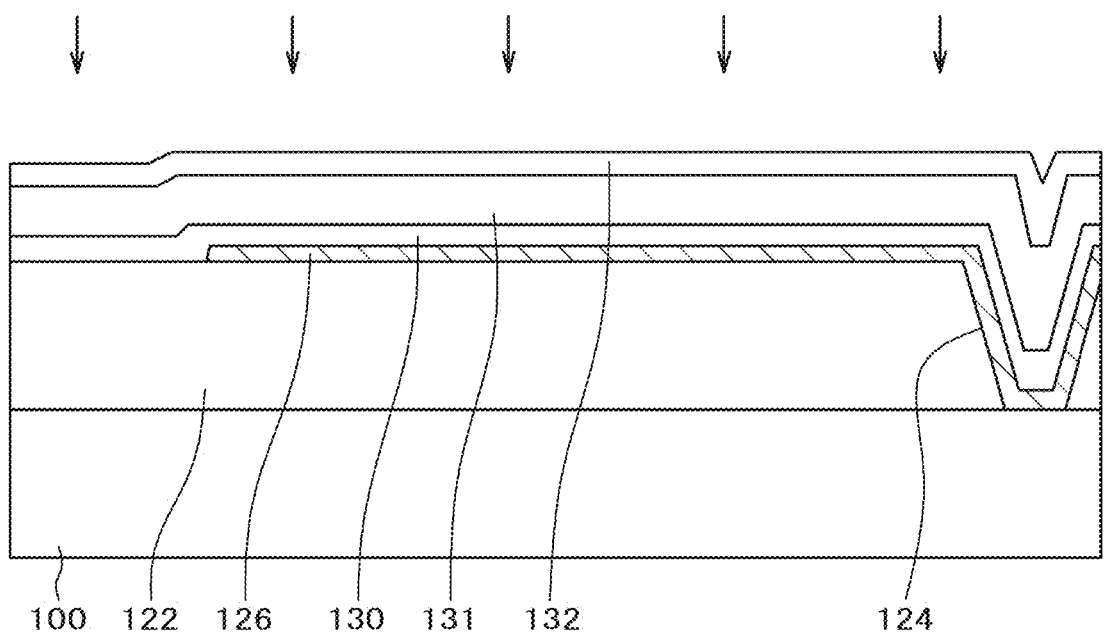
FIG. 11 is a cross-sectional view showing a state in which boron ion implantation is executed on the $P^+$ layer.

FIG. 11 is a cross-sectional view showing a state in which boron ion implantation is executed on the P+ layer. After the P+ layer 132 is formed, boron ions are implanted into the P+ layer 132 by means of ion implantation or ion doping, so that the crystallinity of the P+ layer 132 is deteriorated. In a case where boron ion implantation is executed on the P+ layer 132 by means of ion implantation, boron ions the concentration of which is about $1e^{15}$ atoms/cm$^2$ are implanted into the P+ layer using, for example, an acceleration voltage of about 5 keV. Owing to this boron ion implantation, the etching rate of the P+ layer 132 for dry etching can be conformed to the etching rate of the I layer 131 for dry etching, so that, even if dry etching is executed on the P+ layer 132 and the I layer 131 at the same time, a pent roof-shaped structure can be prevented from being generated at the edges of the P+ layer 132. On the other hand, although the crystallinity of the P+ layer 132 is deteriorated by the boron ion implantation, the carrier concentration of the P+ layer 132 is increased owing to the boron ion implantation, so that the electrical conductivity of the P+ layer 132 is secured or kept intact.

Figure 21:
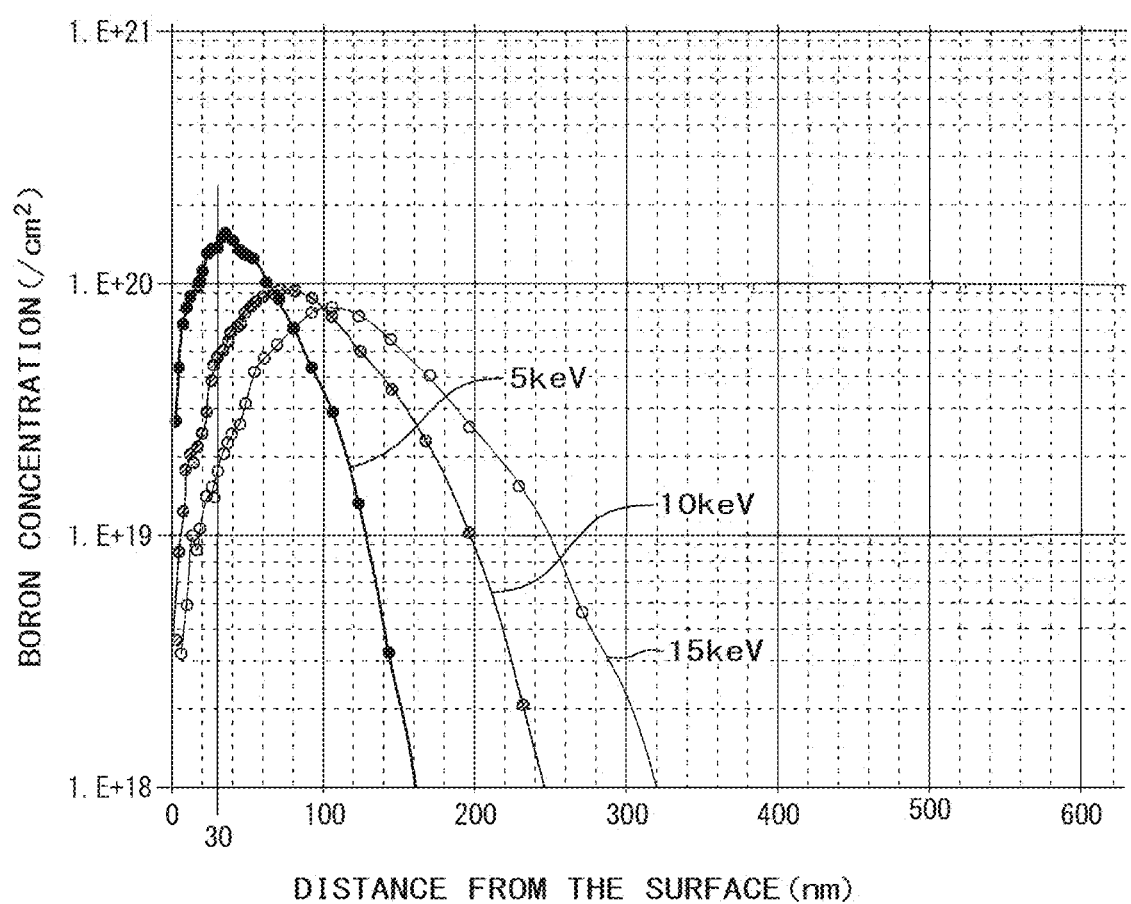
FIG. 21 is a graph for explaining the concentration profiles of boron in ion implantation.

FIG. 21 is a graph for explaining the concentration profiles of boron in ion implantation. In FIG. 21, the vertical axis represents boron concentration (/cm$^2$), and the horizontal axis represents distance (nm) from the surface of the P+ layer. FIG. 21 shows the concentration profiles of boron when the boron ion implantation is executed on crystalline silicon using acceleration voltages of 5 keV, 10 keV, and 15 keV. Even if the film thickness of the P+ layer is thin, for example, 30 nm, boron can be sufficiently implanted into the P+ layer 132 if the acceleration voltage is set to about 5 keV. In this case, it is effective and preferable that the peak of the boron concentration exists in the film of the P+ layer 132. As is clear from FIG. 21, if the acceleration voltage is set to about 5 keV, boron is implanted into the surface region of the I layer 131 (in this example, the distance to the surface region is between 30 nm and 150 nm), but boron is not implanted into the region of the I layer 131 which is deeper than the surface region (the distance to the region of the I layer 131 is between 150 nm and 530 nm). With this, the characteristics of the photodiode can be kept intact.

Figure 12:
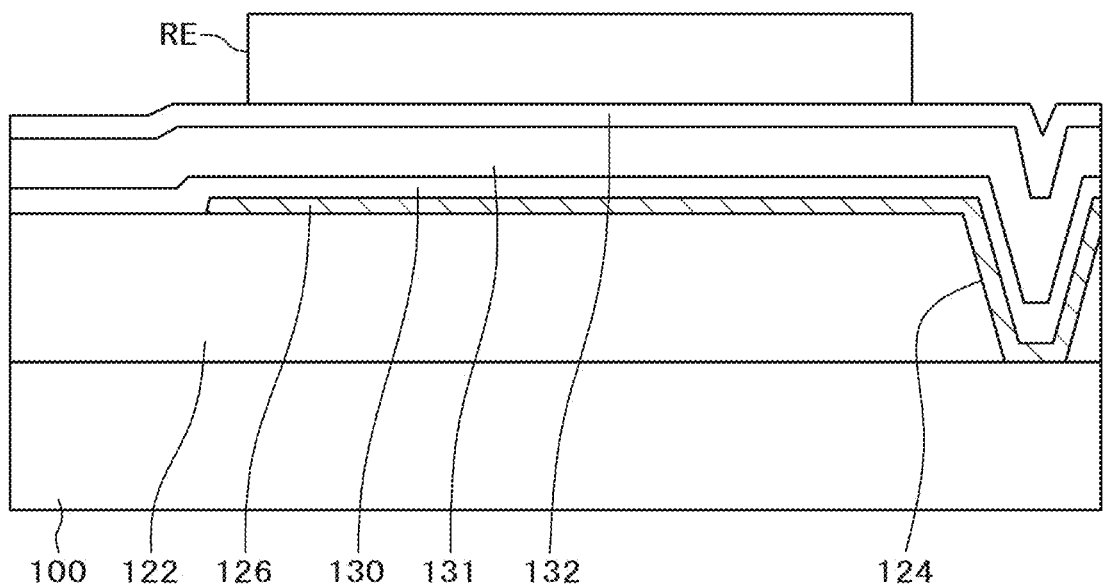
FIG. 12 is a cross-sectional view showing a state in which a resist film is selectively formed.

FIG. 12 is a cross-sectional view showing a state in which a resist film RE is selectively formed. The resist film RE is selectively formed on the P+ layer 132. The resist film RE is formed so as to cover an upper portion of the forming region of a laminated structure 127. Next, using the resist film RE as a mask, dry etching is executed using fluorine (F-based) etching gas in such a way that the P+ layer 132, the I layer 131, and the N+ layer 130 are sequentially etched. The dry etching is executed to the extent that the cathode electrode 126 is exposed. After the dry etching, the resist film RE is removed.

Figure 13:
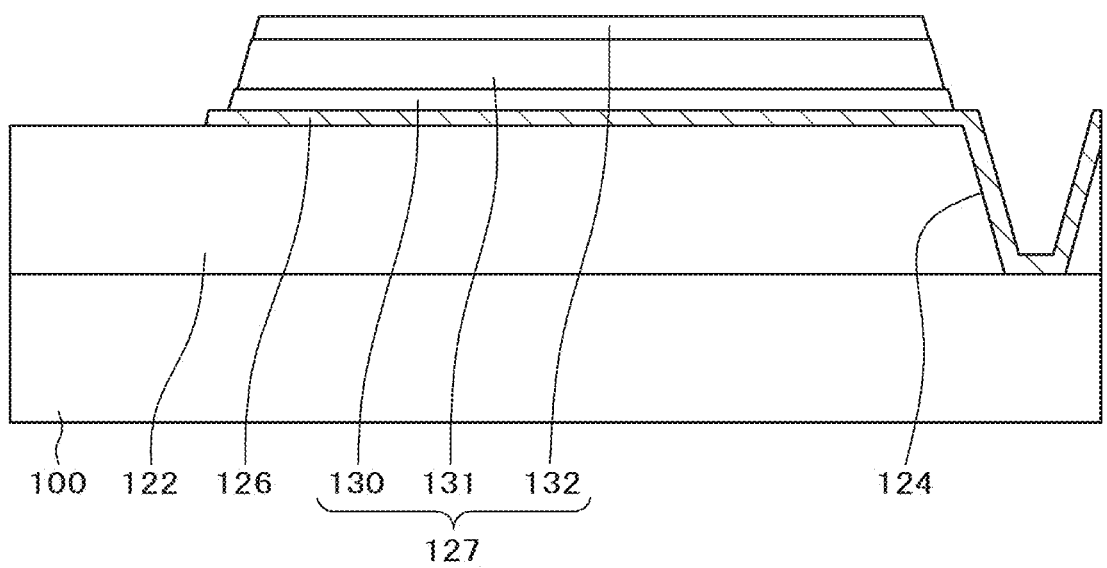
FIG. 13 is a cross-sectional view showing a state in which the resist film is removed.
Figure 14:
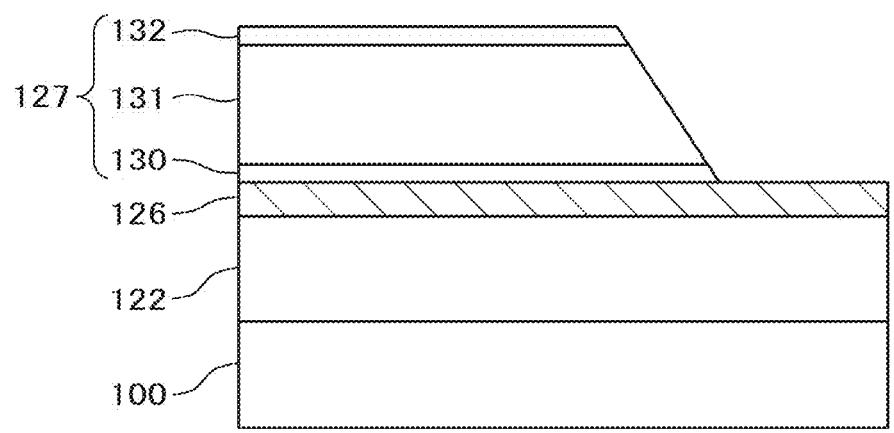
FIG. 14 is a cross-sectional view showing the shapes of the edges of the $P^+$ layer, the I layer, and the $N^+$ layer shown in FIG. 13 in an enlarged form.

FIG. 13 is a cross-sectional view showing a state in which the resist film is removed. FIG. 14 is a cross-sectional view showing the shapes of the edges of the P+ layer, the I layer, and the N+ layer shown in FIG. 13 in an enlarged form. Because the crystallinity of the P+ layer 132 is deteriorated owing to the boron implantation, the etching rate of the P+ layer 132 for dry etching can be conformed to the etching rates of the I layer 131 and N+ layer for dry etching. Therefore, as shown in FIG. 13 and FIG. 14, the shape of the edge of the laminated structure 127 composed of the P+ layer 132, the I layer 131, and the N+ layer 130 can be made a forward tapered shape. In other words, the pent roof-shaped structure of the edge of the P+ layer shown in FIG. 6 is not generated. Furthermore, after the dry etching, boron ions are not implanted into the laminated structure 127.

Figure 15:
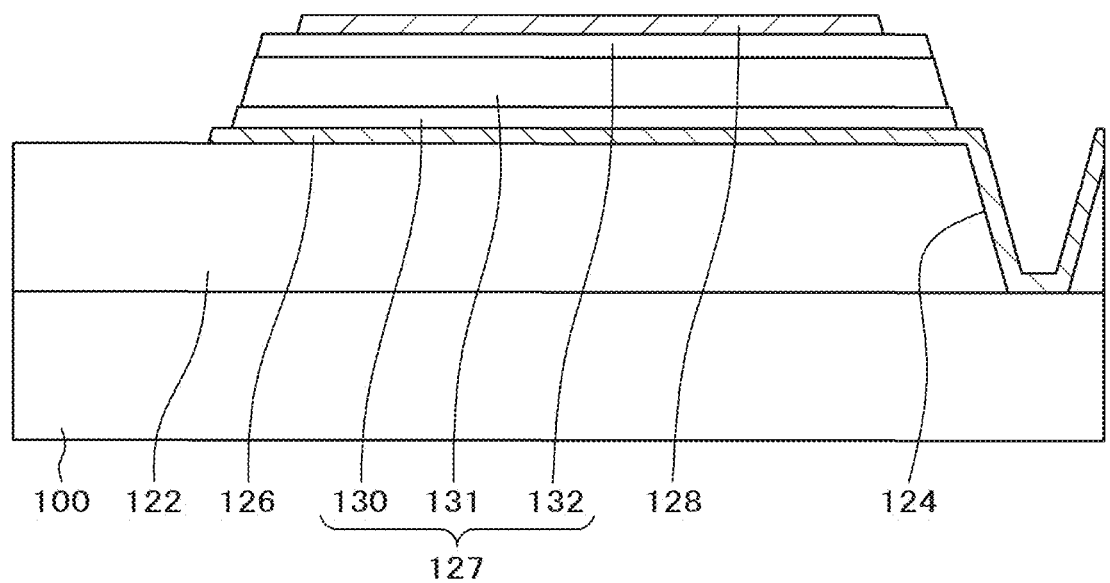
FIG. 15 is a cross-sectional view showing a state in which an anode electrode is formed.

FIG. 15 is a cross-sectional view showing a state in which an anode electrode 128 is formed. The anode electrode 128 is selectively formed on the P+ layer 132. The anode electrode 128 is formed of ITO (indium tin oxide) with its the thickness being, for example, about 50 nm. The ITO film is crystallized by annealing in order to make the electrical resistivity of the ITO film small.

Figure 16:
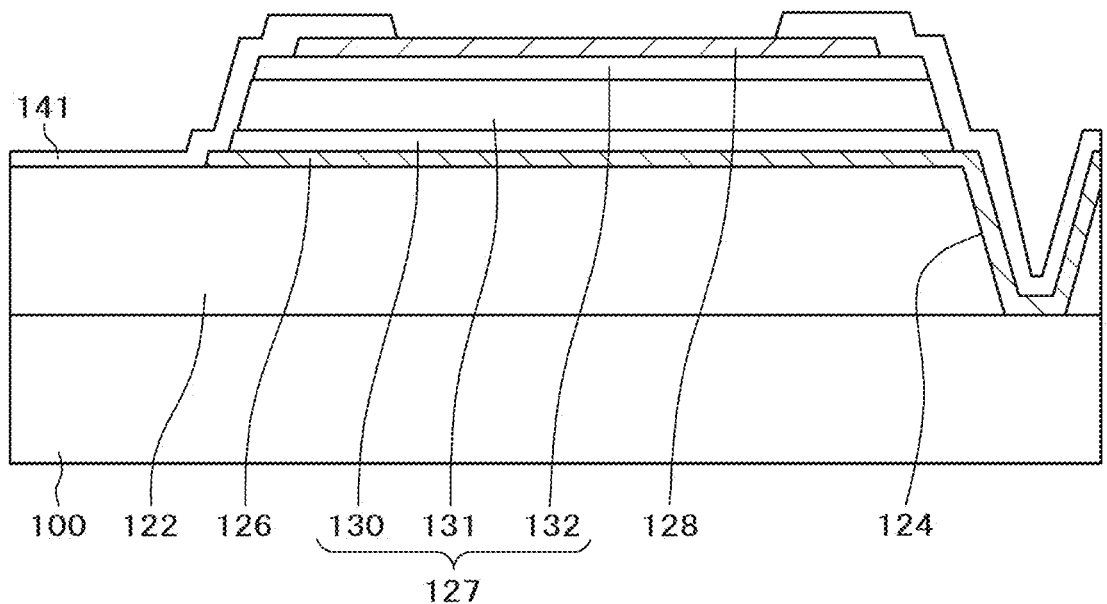
FIG. 16 is a cross-sectional view showing a state in which an inorganic insulating film is selectively formed.

FIG. 16 is a cross-sectional view showing a state in which an inorganic insulating film 141 is selectively formed. The first inorganic insulating film 141 is formed so as to cover the organic insulating film 122, the cathode electrode 126, the laminated structure 17, and the anode electrode 128. Next, a portion of the first inorganic insulating film 141 is removed by etching so that a portion of the anode electrode 128 is exposed. Therefore, the first inorganic insulating film 141 is selectively formed so as to cover a portion of the organic insulating film 122, upper portions of the cathode electrode 126, the edges of the laminated structure 127, and upper portions and the edges of the anode electrode 128. The inorganic insulating film 141 covers the edges of the anode electrode 128 and has an opening that exposes a portion other than the edges of the anode electrode 128 on the anode electrode 128 in a plane view. The inorganic insulating film 141 is formed of, for example, SiN with its thickness being, for example, about 20 nm to 100 nm. Because the inorganic insulating film 141 is formed so as to cover the edges of the laminated structure 127 which are formed in a forward tapered shape, the inorganic insulating film 141 does not have bumps on the edges of the laminated structure 127 accordingly.

Figure 17:
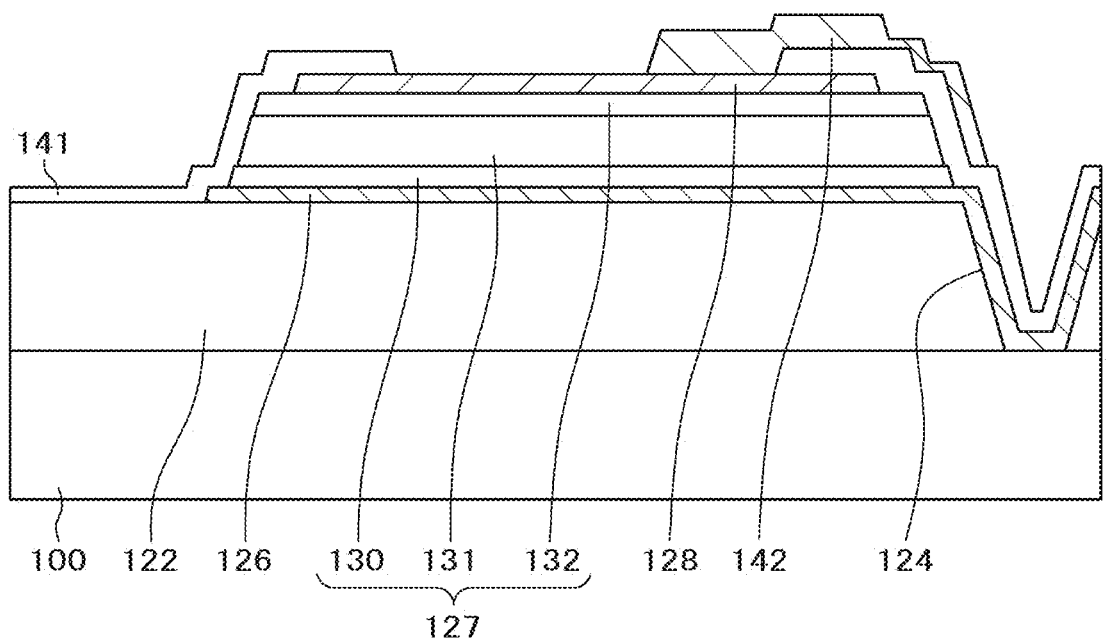
FIG. 17 is a cross-sectional view showing a state in which a metal wiring is formed.
Figure 18:
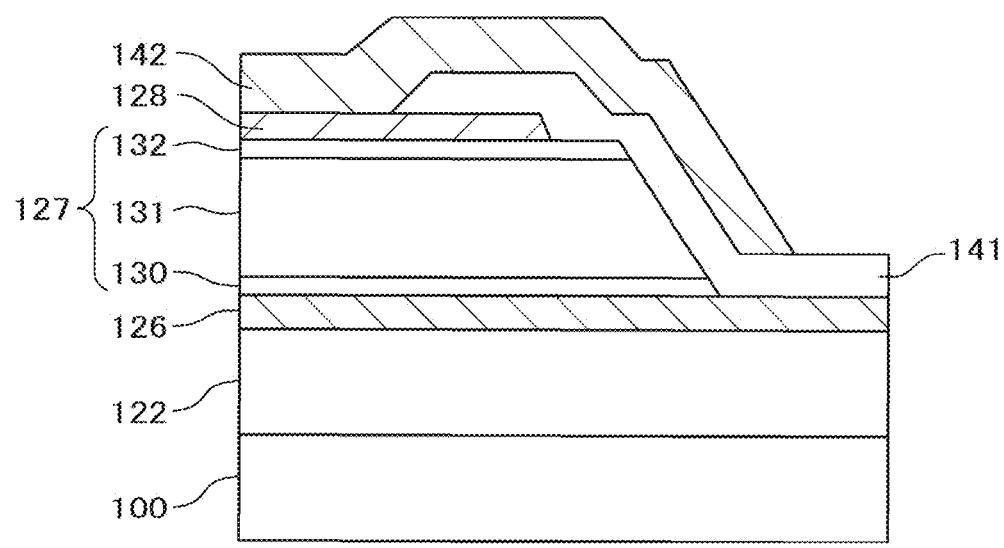
FIG. 18 is a cross-sectional view showing the forming region of the metal wiring shown in FIG. 17 in an enlarged form.

FIG. 17 is a cross-sectional view showing a state in which a metal wiring 142 is formed. FIG. 18 is a cross-sectional view showing the forming region of the metal wiring 142 shown in FIG. 17 in an enlarged form. The metal wiring 142 is selectively formed so as to cover an upper portion of the anode electrode 128 and an upper portion of the inorganic insulating film 141. The metal wiring 142 is formed so as to be connected to a portion of the anode electrode 128 that is exposed from the opening of the inorganic insulating film 141. The metal wiring 142 has a role of an outgoing line for the anode electrode 128 and the metal wiring 142 is connected to an electric power line 13 accordingly. As shown in FIG. 18, because the metal wiring 142 is formed on an upper portion of the inorganic insulating film 141 that covers an edge of the laminated structure 127 formed in a forward tapered shape, there is no possibility that the metal wiring 142 comes down.

Figure 19:
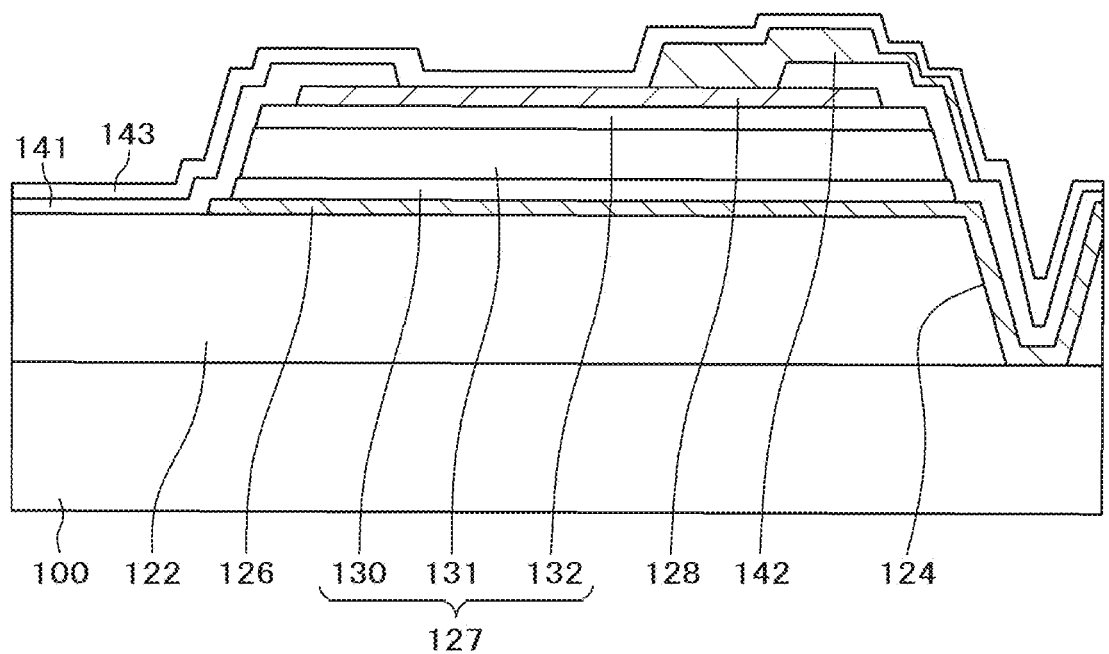
FIG. 19 is a cross-sectional view showing a state in which an inorganic insulating film is formed.

FIG. 19 is a cross-sectional view showing a state in which an inorganic insulating film 143 is formed. The second inorganic insulating film 143 is formed so as to cover the inorganic insulating film 141, a portion of the anode electrode 128, and the metal wiring 142. The inorganic insulating film 143 is formed of, for example, SiN with its thickness being, for example, being about 20 nm to 100 nm.

Figure 20:
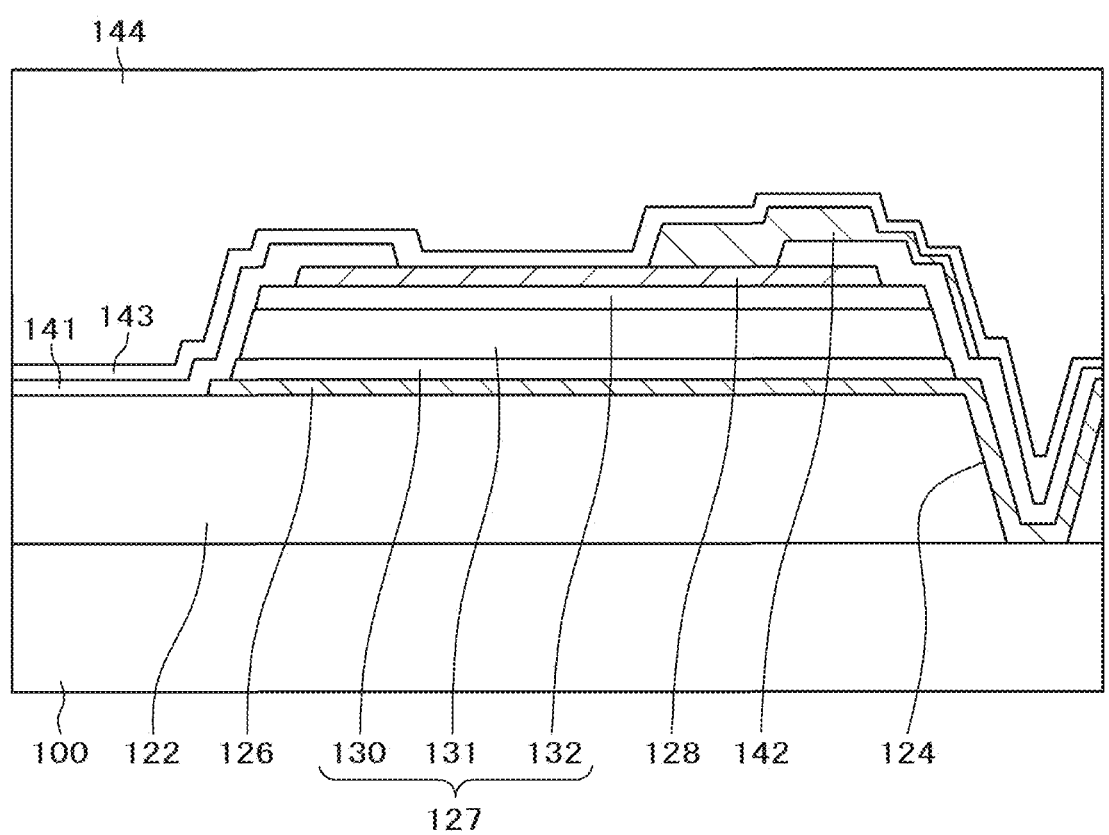
FIG. 20 is a cross-sectional view showing a state in which an organic insulating film is formed.

FIG. 20 is a cross-sectional view showing a state in which an organic insulating film is formed. The second organic insulating film 144 is formed so as to cover the second inorganic insulating film 143. Because the organic insulating film 144 also functions as a planarization film, the organic insulating film 144 is formed in such a way that the thickness of the organic insulating film 144 is large, for example, about 2.0 µm to 2.5 µm. With this, the semiconductor device 1 is formed as a photosensor device.

Although the manufacturing processes of the polysilicon semiconductor TFT and the oxide semiconductor TFT explained in FIG. 4 are not explained in the explanations of the abovementioned manufacturing methods, the polysilicon semiconductor TFT and the oxide semiconductor TFT are formed on the substrate 100 before the organic insulating film 122 explained in FIG. 8 is formed. Subsequently, after the polysilicon semiconductor TFT and the oxide semiconductor TFT are formed, the organic insulating film 122 is formed so as to cover the polysilicon semiconductor TFT and the oxide semiconductor TFT.

In the abovementioned explanations, although the present invention has been explained so far using a configuration example of a stand-alone type photosensor device, the present invention can be applied not only to such a stand-alone type photosensor device, but also to a photosensor device that can be built in an organic EL display device using organic EL films or the like. In addition, a photosensor device according to the present invention can be mounted on a display panel of a liquid crystal display device, an organic EL display device, and the like.

It is conceivable that all semiconductor devices that can be implemented by those skilled in the art through appropriate design modifications on the basis of the above-described semiconductor devices according to the embodiment of the present invention fall within the scope of the present invention as long as these semiconductor devices include the gist of the present invention.

It should be understood that, if various alternations and modifications are easily conceived by those skilled in the art within the idea of the present invention, those alternations and modifications also fall within the scope of the present invention. For example, devices obtained in the case where those skilled in the art appropriately add components to the above-described embodiment, delete components from the above-described embodiment, perform design changes to the above-described embodiment, add processes to original processes for the above-described embodiment, omit processes from the original processes, or alter conditions for implementing the above-described embodiment fall within the scope of the present invention as long as the devices do not deviate from the gist of the present invention.

In addition, as for other operational effects brought about by the present embodiment, it should be obviously understood that some of the other operational effects, which are clear from the descriptions of the present specification and can be accordingly conceived by those skilled in the art, are brought about by the present invention.

Various inventions can be achieved by appropriately combining plural components disclosed in the above-described embodiment. For example, a new invention will be achieved by deleting some components from all the components included in the embodiment. Alternatively, another new invention will be achieved by appropriately combining components from the above-described embodiment.

What is claimed is:
1. A semiconductor device comprising a photosensor including a photodiode formed on a substrate,
   wherein the photodiode includes:
      a cathode electrode;
      a laminated structure that is formed on the cathode electrode and in which an N+ layer, an I layer, and a P+ layer are laminated in this order;
      an anode electrode formed on the P+ layer;

a first insulating film formed so as to cover a portion of the anode electrode and edges of the laminated structure; and a metal wiring connected to the anode electrode, and the edges of the laminated structure are formed in forward tapered shapes in a cross-sectional view, wherein each of the $N^+$ layer, the I layer, and the $P^+$ layer is formed of a-Si film, wherein the crystallinity of the $P^+$ layer is more deteriorated in comparison with the crystallinity of the I layer, and wherein boron ion implantation is executed on the $P^+$ layer after the $P^+$ layer is formed.

2. The semiconductor device according to claim 1, wherein the photosensor includes:

a scanning line;
 a detecting line;
 an electric power line connected to the anode electrode via the metal wire; and
 a switching TFT having a drain connected to the detecting line, a source connected to the cathode electrode, and a gate connected to the scanning line, and the switching TFT is formed in lower layers than layers in which the photodiode is formed on the substrate.

3. The semiconductor device according to claim 1, further comprising:

a first organic insulating film formed under the cathode electrode;
 a second insulating film covering the first insulating film, a portion of the anode electrode, and the metal wiring, and
 a second organic insulating film covering the second insulating film.

\* \* \* \* \*